United States Patent
Sasaki et al.

[19]

[11] Patent Number: 6,133,672

[45] Date of Patent: Oct. 17, 2000

[54] DRIVING METHOD OF PIEZOELECTRIC TRANSFORMER AND DRIVING CIRCUIT FOR THE SAME

[75] Inventors: Hiroshi Sasaki; Kouichi Iguchi, both of Tokyo, Japan

[73] Assignee: NEC Corporation, Tokyo, Japan

[21] Appl. No.: 09/252,882

[22] Filed: Feb. 18, 1999

[30] Foreign Application Priority Data

Feb. 27, 1998 [JP] Japan .................................. 10-061993

[51] Int. Cl.$^7$ .................................................. H01L 41/107
[52] U.S. Cl. ........................................................... 310/318
[58] Field of Search ........................ 310/316.01, 316.03, 310/318

[56] References Cited

U.S. PATENT DOCUMENTS

| | | | |
|---|---|---|---|
| 3,708,701 | 1/1973 | Kawada | 310/318 |
| 5,739,622 | 4/1998 | Zaitsu | 310/316.01 |
| 5,796,213 | 8/1998 | Kawasaki | 310/316.01 |
| 5,923,542 | 7/1999 | Sasaki et al. | 310/318 |
| 6,013,969 | 1/2000 | Noma et al. | 310/318 |

FOREIGN PATENT DOCUMENTS

| | | | |
|---|---|---|---|
| 8-275553 | 10/1996 | Japan | H02M 7/538 |
| 9-23643 | 1/1997 | Japan | H02M 3/24 |

*Primary Examiner*—Thomas M. Dougherty
*Attorney, Agent, or Firm*—Sughrue, Mion, Zinn, Macpeak & Seas, PLLC

[57] ABSTRACT

A circuit for driving a piezoelectric transformer, which is suitable for driving a piezoelectric transformer having a load such as a cold cathode fluorescent tube, and capable of coping with a wide range of a power source voltage and operating with high efficiency. The driving circuit includes a series circuit constituted by an equivalent input capacitance of the piezoelectric transformer and an inductance circuit and provided between power source terminals, and a switching transistor having both terminals of a main current path thereof in parallel connected to a part of the series circuit including the equivalent input capacitance. The inductance circuit includes a first inductance element of boosting constitution such as an auto-transformer and a second inductance element of non-boosting constitution such as a coil. The first and second inductance elements are selectable alternately. The driving circuit further includes an amplitude detection circuit for detecting an amplitude of a driving waveform between the terminals of the main current path of the switching transistor, and an inductance selection circuit for selecting the first inductance element when the amplitude is lower than a predetermined threshold value and for selecting the second inductance element when the amplitude exceeds the predetermined threshold value.

21 Claims, 6 Drawing Sheets

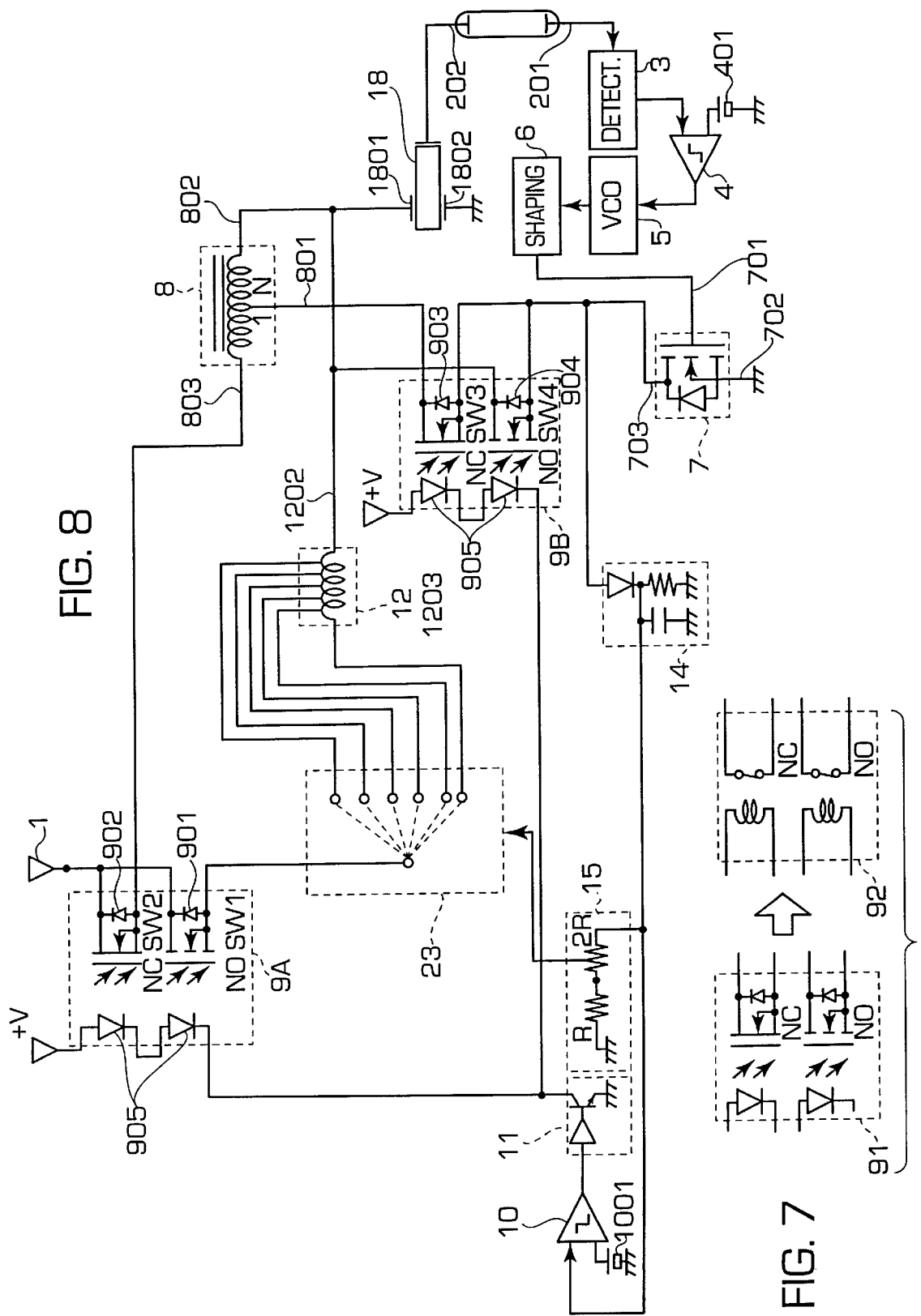

DRIVING METHOD OF PIEZOELECTRIC TRANSFORMER AND DRIVING CIRCUIT FOR THE SAME

BACKGROUND OF THE INVENTION

1. Field of the Invention

The present invention relates to a driving method of a piezoelectric transformer and a driving circuit for the piezoelectric transformer, more particularly to a method which is capable of driving a piezoelectric transformer with high efficiency and coping with a wide range of the power source voltage, and a circuit which drives a piezoelectric transformer with high efficiency and is operable with a wide range of the power source voltage. The driving method and the driving circuit of the present invention are suitably used for driving the piezoelectric transformer which operates, for example, a cold cathode fluorescent tube as a load.

2. Description of the Prior Art

A piezoelectric transformer is a mechanical-electrical transforming device which generates mechanical vibrations utilizing a piezoelectric effect and produces a voltage to be fetched therefrom. Since the piezoelectric transformer exhibits higher transformation efficiency compared to an electromagnetic transformer and can be fabricated to be small-sized, it has been principally used as elements which constitute an inverter and a DC-DC converter for driving a back-light of a color liquid crystal display panel (color LCD panel). A cold cathode fluorescent tube has been ordinarily used for the back-light of the LCD panel, so that to acquire a high AC voltage or a DC voltage necessary for driving the cold cathode tube, the inverter or the DC-DC converter in which the piezoelectric transformer is built is used.

Recently, the color LCD panel have used widely for not only notebook type personal computers (PCs) for but also personal digital assistances (PDAs) and monitors of car-navigation systems. When the notebook type PCs, the PDAs and the monitors of the car-navigation systems are used, the performance required for the inverter and converter of the LCD panel is high transformation efficiency and an operation in a wide voltage range so as to be able to cope with a AC power supply adapter and a battery.

As circuits for driving the piezoelectric transformers, Japanese Patent Laid-open publications No. 8-275553 (JP, 08275553, A) and No. 9-23643 (JP, 09023643, A) disclose an inverter for transforming a comparatively low DC power source voltage to a high AC voltage or a DC-DC converter for transforming the low DC power source voltage to a high DC voltage.

FIG. 1 shows a piezoelectric transformer driving circuit disclosed in JP, 08275553, A. This driving circuit comprises piezoelectric transformer 51 having primary side electrodes 511 and 512 and a pair of secondary side electrodes 513; auto-transformers 55 and 56 connected to primary side electrodes 511 and 512, respectively; switching transistors 58 and 59 for driving primary side electrodes 511 and 512 through auto-transformers 55 and 56, respectively; two-phase driving circuit 57 for complementarily driving switching transistors 58 and 59 to each other; and frequency control circuit 53 for making the amplitude peak value of load current I0 invariable. Load 52 is connected to secondary electrodes 513 of piezoelectric transformer 51.

More concretely, in piezoelectric transformer 51 which boosts (amplifies) the AC voltage inputted from the primary side circuit utilizing the piezoelectric effect and outputs the boosted AC voltage to the secondary side circuit, the secondary side output terminal of first auto-transformer 55 is connected to primary side electrode 511, and the intermediate tap of first auto-transformer 55 is connected to one output terminal 581 of first switching transistor 58. The primary side terminal of first auto-transformer 55 is connected to connection terminal 50 conducted to DC power source $V_{DD}$. Control terminal 582 of first switching transistor 58 is connected to two-phase driving circuit 57, and the other output terminal 583 of first switching transistor 58 is grounded. The secondary side terminal of second auto-transformer 56 is connected to the other primary side electrode 512 of piezoelectric transformer 51, the intermediate tap of this second auto-transformer 56 is connected to one output terminal 591 of second switching transistor 59, and the primary side terminal of second auto-transformer 56 is connected to connection terminal 50. Control terminal 592 of second switching transistor 59 is connected to two-phase driving circuit 57, and the other output terminal 593 of second switching transistor 59 is grounded. Driving circuit 54 of piezoelectric transformer 51 is constituted by the primary side portion of piezoelectric transformer 51, auto-transformers 55 and 56, switching transistors 58 and 59 and two-phase driving circuit 57. It is assumed that the turn ratio of auto-transformers is N.

The driving frequency of piezoelectric transformer 51 is controlled by frequency control circuit 53 so that load current Io flowing across load 52 is invariable. The driving frequency is divided by two-phase driving circuit 57 and is subjected to a waveform shaping, whereby first and second switching transistors 58 and 59 are alternately driven.

When first switching transistor 58 is at a turning-on state and second switching transistor 59 is at a turning-off state, a current flows into the primary side of first auto-transformer 55 from DC power source $V_{DD}$, and energy is charged in auto-transformer 55. Moreover, since a resonance circuit is constituted by each capacitance of second auto-transformer 56 and primary side portion of piezoelectric transformer 51 and a secondary side winding of first auto-transformer 55, half-wave sine waves are generated in primary side electrode 512 of piezoelectric transformer 51, which have a voltage amplitude obtained in such manner that the power source voltage is tripled and the tripled value is further multiplied by N+1. Similarly, when first switching transistor 58 is at the turning-off state and second switching transistor 59 is at the turning-on state, a current flows into the primary side of second auto-transformer 56 from DC power source $V_{DD}$, and energy is charged in auto-transformer 56. Furthermore, another resonance circuit is constituted by each capacitance of first auto-transformer 55 and the primary side portion of piezoelectric transformer 51 and a secondary side winding of second auto-transformer 56, whereby half-wave sine waves are generated in the other primary side electrode 511 of piezoelectric transformer 51, which have a voltage amplitude obtained in such manner that the power source voltage is tripled and the tripled value is further multiplied by N+1.

Iterating such operations alternately allows piezoelectric transformer 51 to perform an AC driving at an arbitrary driving frequency. The boosting ratio of the piezoelectric transformer varies depending on its load impedance and driving frequency. Particularly, its boosting ratio becomes maximum at a resonance frequency.

Like the cold cathode fluorescent tube, in the case of a load which needs high voltages more than 1500 $V_{rms}$ for a lightning starting voltage and equal to about 500 $V_{rms}$ for a lightning voltage, since the load can not be lighted only by the boosting using the piezoelectric transformer when the power source voltage is low, the turn ratio of the auto-transformer is set to N and the driving waveform of the piezoelectric transformer is previously boosted to a value equal to (N+1) times as high as that by the auto-transformer. This boosting is called a primary boosting, and it will be possible to start an operation of the inverter by an arbitrary low power source voltage.

However, in this piezoelectric transformer driving circuit, even when the power source voltage is elevated to a value which requires no primary boosting by the auto-transformer, the auto-transformer is physically connected thereto, so that the primary boosting is continued. At this time, in order to maintain a constant output voltage to the load, the frequency control circuit makes the driving frequency to keep away from the resonance frequency, whereby it controls the piezoelectric transformer so as to lower its boost ratio. In the end, although the piezoelectric transformer driving circuit disclosed JP, 08275553, A can drive the load at a range from an arbitrary low power source to a high voltage by using the auto-transformer, it involves a problem of a reduction in driving efficiency due to a loss in the auto-transformer and a limitation to a operation voltage range due to a deformation of the driving waveform.

FIG. 2 shows a piezoelectric transformer driving circuit disclosed in JP, 09023643, A. This driving circuit comprises a piezoelectric transformer 61 having primary side electrodes 611 and 612 and secondary side electrodes 613; coil 62 provided in series between power source Vp and piezoelectric transformer 61; switching transistor 63 for driving primary side electrodes 611 and 612; an oscillator IC (integrated circuit) 65 for driving switching transistor 63; and load circuit 66 connected to secondary side electrode 613 of piezoelectric transformer 61. Here, load circuit 66 includes a voltage multiplying rectifying circuit and load 67. More concretely, one primary side celectrode 611 of piezoelectric transformer 61 is connected to one terminal 621 of coil 62 and one output terminal 631 of switching transistor 63, and the other primary electrode 612 of piezoelectric transformer 61 is grounded. The other terminal 622 of coil 62 is connected to connection terminal 64 conducted to DC power source $V_p$, and the other output terminal 632 of switching transistor 63 is grounded. Control terminal 633 of switching transistor 63 is connected to an output terminal of oscillator IC 65.

Oscillator IC 65 outputs a control signal to allow switching transistor 63 to perform turning-on and turning-off operations. When switching transistor 63 is at a turning-on state, a current flows across coil 62 from DC power source $V_p$, and energy is charged in coil 62. When switching transistor 63 is at a turning-off state, a resonance circuit is constituted by coil 62 and capacitance of the primary side portion of piezoelectric transformer 61, so that half-wave sine waves having a voltage amplitude higher than that of the power source are generated in one primary side electrode 611 of piezoelectric transformer 61. Switching transistor 63 performs the turning-on and turning-off operations alternately, whereby piezoelectric transformer 61 is allowed to perform an AC driving at an arbitrary driving frequency. The boost ratio of piezoelectric transformer 61 varies depending on a load impedance and the driving frequency, and particularly piezoelectric transformer 61 exhibits the maximum boost ratio and the maximum transformation efficiency at its resonance frequency.

Since the piezoelectric transformer driving circuit disclosed in JP, 09023643, A comprises no loss factor like the auto-transformer, it can drive the piezoelectric transformer with high efficiency. However, in the case of a load like the cold cathode fluorescent tube which needs high voltages more than 1500 $V_{rms}$ for a lightning starting voltage and equal to about 500 $V_{rms}$ for a lightning voltage, the boost ratio of the piezoelectric transformer lacks when the power source voltage is low, and this piezoelectric transformer driving circuit can not perform a load driving required.

SUMMARY OF THE INVENTION

The object of the present invention is to provide a method for driving a piezoelectric transformer which is capable of being applied to a wide range power source voltage and performing a high voltage output with high driving efficiency.

Another object of the present invention is to provide a piezoelectric transformer driving circuit which operates for a wide range power source voltage and is capable of performing a high voltage output with high driving efficiency.

A further object of the present invention is to provide a method for driving a piezoelectric transformer which is suitable for a load such as a cold cathode fluorescent tube.

Still further object of the present invention is to provide a piezoelectric transformer driving circuit which is suitable for a load such as a cold cathode fluorescent tube.

The first object of the present invention is achieved by a method for driving a piezoelectric transformer wherein an equivalent input capacitance of a piezoelectric transformer and an inductance are provided in series between a pair of power source terminals, and a circuit including the equivalent input capacitance is partially short-circuited by a main current path of a switching transistor provided in parallel with the circuit, comprising the steps of: preparing a first inductance element of boosting constitution (having high voltage gain characteristics) and a second inductance element of non-boosting constitution (having high voltage gain characteristics), as the inductance; detecting an amplitude of a driving waveform across the main current path of the switching transistor; and switching a connection of the piezoelectric transformer with the inductance from the first inductance element to the second inductance element when the amplitude of the driving waveform exceeds a predetermined threshold value.

The second object of the present invention is achieved by a driving circuit for driving a piezoelectric transformer, comprising a series circuit constituted by an equivalent input capacitance of the piezoelectric transformer and an inductance circuit and provided between power source terminals, the inductance circuit including a first inductance element of boosting constitution and a second inductance element of non-boosting constitution, the first and second inductance elements being selectable alternately; a switching transistor having both terminals of a main current path thereof in parallel connected to a part of the series circuit including the equivalent input capacitance; an amplitude detection circuit for detecting an amplitude of a driving waveform between the terminals of the main current path of the switching transistor; and an inductance selection circuit for selecting the first inductance element when the amplitude is lower than a predetermined threshold value and for selecting the second inductance element when the amplitude exceeds the predetermined threshold value.

The method for driving a piezoelectric transformer and the piezoelectric transformer driving circuit of the present invention is suitable for driving a piezoelectric transformer having a load such as a cold cathode fluorescent tube.

According to the present invention, it is possible to drive the piezoelectric transformer with high efficiency and at a wide range operation voltage. This is because by combining a frequency characteristic of the piezoelectric transformer and a primary boosting (amplification) by the inductance. In the case of a low power source voltage the piezoelectric transformer is driven by a driving circuit for compensating a shortage of a boost ratio (insufficient voltage amplification) of the piezoelectric transformer by a primary boosting and in the case of the power source voltage requiring no primary boosting the piezoelectric transformer is driven by another driving circuit of high efficiency without performing primary boosting. The driving circuit of the present invention has a versatility for load conditions as a high efficiency driving circuit of the piezoelectric transformer.

Furthermore, according to the present invention, the selection of the driving circuit can be determined based on the amplitude of the switching voltage waveform of the driving circuit. Thus, the piezoelectric transformer can be driven under the optimum condition depending on variations of the power source voltage.

Particularly, the present invention can be applied to, for example, an inverter circuit for lighting a cold cathode fluorescent tube at a wide range of power source voltage and with high efficiency. The reason of this is as follows: The piezoelectric transformer has a frequency characteristic in which it exhibits a high boost ratio for a high load impedance of the cold cathode fluorescent tube. Considering the characteristic of the cold cathode fluorescent tube that needs a high voltage of, for example, about 1500 $V_{rms}$ at the time of starting lighting it and a low normal light voltage of, for example, about 500 $V_{rms}$ after lightning it, the piezoelectric transformer is driven with a high boost ratio at the time of starting lighting the tube and the piezoelectric transformer generates a high voltage and the light of the fluorescent tube can be started. Then the impedance of the fluorescent tube reduces after lightning it and the maximum boost ratio of the piezoelectric transformer also reduces, thus enabling keeping the light of the cold cathode fluorescent tube.

Furthermore, in the present invention, in the driving operation of the piezoelectric transformer by the inductance of non-boosting constitution in which no primary boosting of the power source voltage is performed, the automatic selection of the inductance is available so as to produce a driving waveform which causes a less loss.

The piezoelectric transformer changes the circuit constants of the equivalent circuit thereof depending on an objected boost ratio, a load and an output power. Since the equivalent capacitance of the primary side of the piezoelectric transformer constitutes also a part of the driving circuit, with the change of the circuit constants of the equivalent circuit the optimum circuit constant of the driving circuit also changes. By making changeable the value of the inductance of non-boosting constitution for such changes of the circuit constants, matching between the inductance and the equivalent capacitance of the primary side of the piezoelectric capacitance can be made easier.

The above and other objects, features and advantages of the present invention will be apparent from the following description referring to the accompanying drawings which illustrate examples of preferred embodiments of the present invention.

BRIEF DESCRIPTION OF THE DRAWINGS

FIG. 7 is a diagram for explaining a correspondence of an optically coupled transistor switch with an electromagnetic relay; and FIG. 8 is a circuit diagram showing a constitution of a piezoelectric transformer driving circuit of another embodiment of the present invention.

DESCRIPTION OF THE PREFERRED EMBODIMENTS

Preferred embodiments of the present invention will be described exemplifying a case where a cold cathode fluorescent tube is connected to a piezoelectric transformer as its load.

Figure 1:
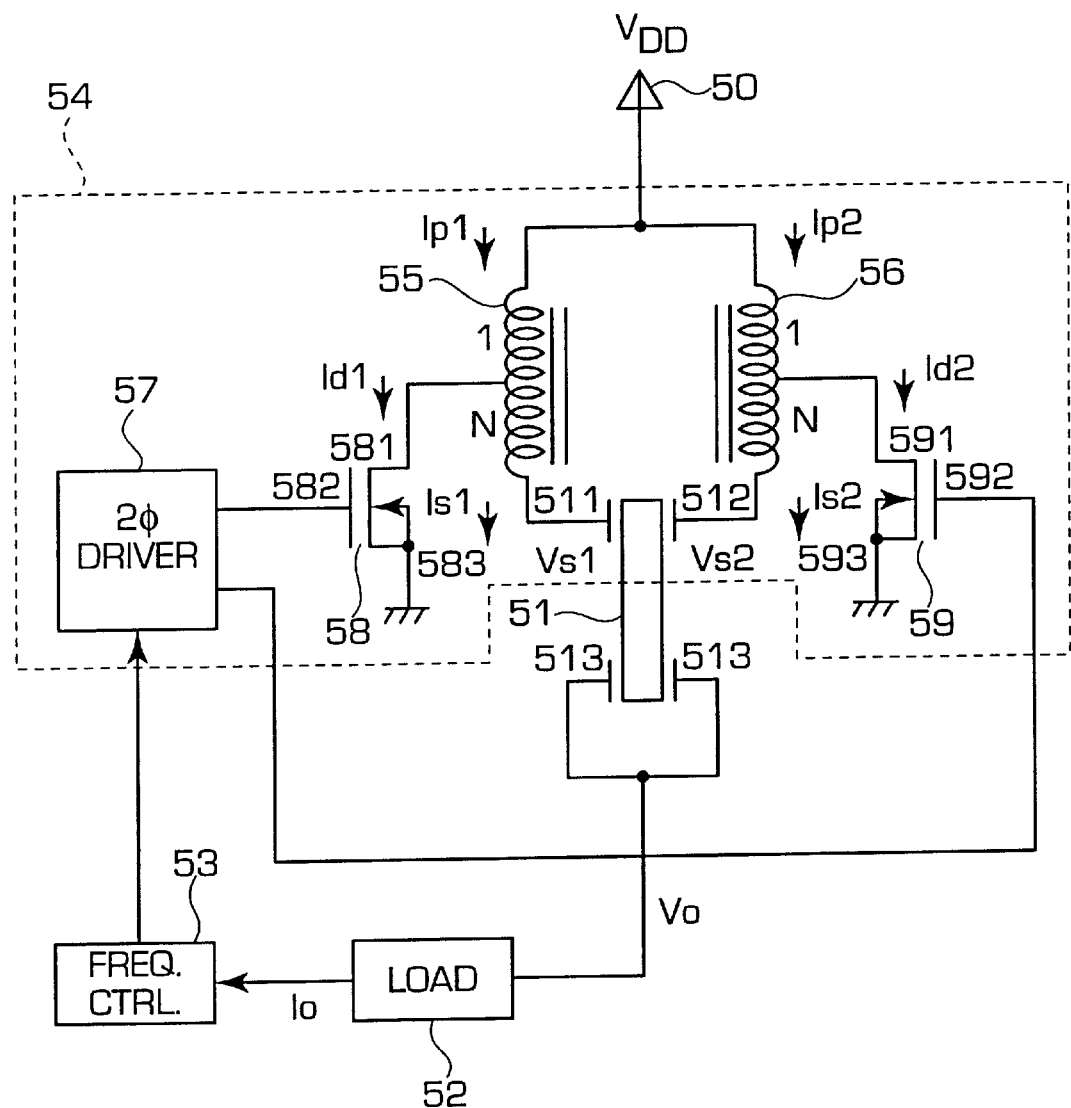
FIG. 1 is a circuit diagram showing an example of a conventional piezoelectric transformer driving circuit.
Figure 2:
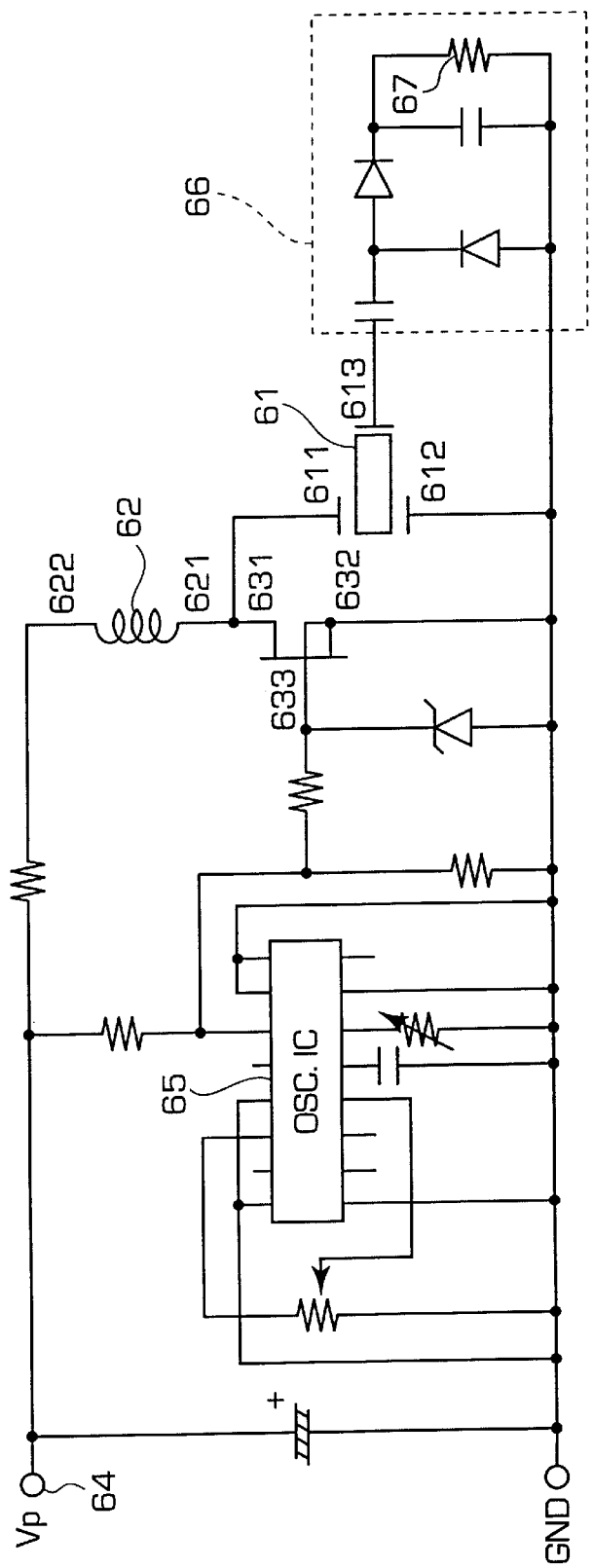
FIG. 2 is a circuit diagram showing another example of a conventional piezoelectric transformer driving circuit.
Figure 3:
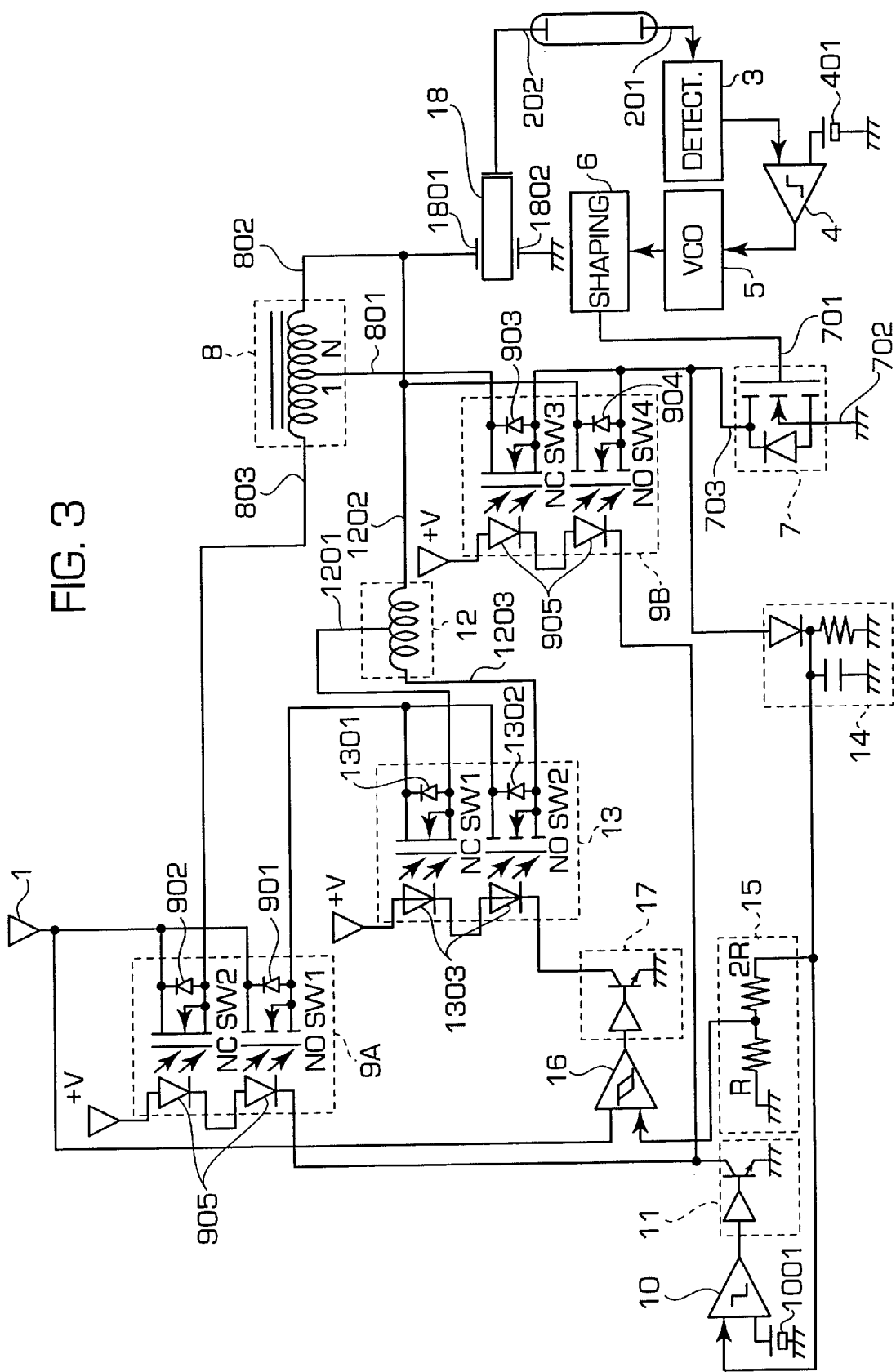
FIG. 3 is a circuit diagram showing a constitution of a piezoelectric transformer driving circuit according to a preferred embodiment of the present invention.

A piezoelectric transformer driving circuit of a preferred embodiment of the present invention shown in FIG. 3 drives piezoelectric transformer 18, thereby supplying a high voltage current to cold cathode discharge tube 2 serving as a load. Roughly dividing this piezoelectric transformer driving circuit, the piezoelectric transformer driving circuit comprises a first driving circuit section using autotransformer 8 for generating a driving voltage to primary side electrode 1801 of piezoelectric transformer 18 and second driving circuit section using coil 12 similarly for generating a driving voltage to primary side electrode 1801.

The first driving circuit section is a circuit in which a current flowing through normally-on type (depletion type) transistors 902 and 903, produced by switching operations of driving transistor 7, causes a high voltage from output side terminal 802 of auto-transformer 8. On the other hand, the second driving circuit section is a circuit in which coil 12 is driven by a current flowing though normally-off type (enhancement type) transistors 901, 904 and 1302, produced by the switching operations of driving transistor 7, thus generating a voltage from output side terminal 1202 of coil 12. Referring FIG. 3, the transistor denoted by reference symbol "NC" is a normally-close type transistor, that is, a normally-on type transistor, and the transistor denoted by reference symbol "NO" is a normally-open type transistor, that is, a normally-off transistor. Piezoelectric transformer 18 is driven by either the first driving circuit section or the second driving circuit section, and load 2 is driven by the output of piezoelectric -transformer 8.

The switching operations of driving transistor 7 are controlled by an output of voltage control oscillator (VCO) 5, and the output frequency of voltage control oscillator 5 is controlled based on a current flowing through load 2.

Switching relay 9A serving as an optically coupled transistor switching circuit is constituted by normally-off type transistor 901 and normally-on type transistor 902. Similarly, switching relay 9B is constituted by transistors 903 and 904. Switching relays 9A and. 9B are controlled by a DC component between the terminals of the main current path of driving transistor 7. This DC component is detected by peak detection circuit 14. When the detected DC voltage is equal to reference voltage 1001 of comparator 10 or less, switching driver 11 controls each of switching relays 9A and 9B to allow normally-on type transistors 902 and 903 to turn on, thereby operating the first driving circuit section. When the DC component excesses reference voltage 1001, switching driver 11 controls each of switching relays 9A and 9B to allow normally-off type transistors to turn on, thereby operating second driving circuit section.

In this driving circuit, in order to switch driving input terminals of coil 12 in the second driving circuit section, provided is adjustment relay 13 serving as an optically coupled transistor switch. In adjustment relay 13, provided are normally-on type transistor 1301 and normally-off type transistor 1302. By providing adjusting relay 13, when a DC voltage between the terminals of the main current path of driving transistor 7 excesses reference voltage 1001, adjusting relay driver 17 switches adjusting relay 13 to allow one of transistors 1301 and 1302 to turn on, thus switching the driving input terminals of coil 12.

A constitution of this driving circuit will be described in more detail below.

One end 201 of cold cathode fluorescent tube 2 as the load is connected to tube current detection circuit 3, and an output of tube current detection circuit 3 is connected to comparator 4 to which reference voltage source 401 is connected. An output of comparator 4 is connected to voltage control oscillator 5. An output of voltage control oscillator 5 is connected to waveform shaping circuit 6, and an output of waveform shaping circuit 6 is connected to gate terminal 701 of driving transistor 7. Source terminal 702 of driving transistor 7 is grounded, and drain terminal 703 is connected to peak voltage detection circuit 14 and transistors 903 and 904 of switching relay 9B. An output of peak voltage detection circuit 14 is connected to ⅓ (one third) voltage dividing circuit 15 and comparator 10 to which reference voltage source 1001 is connected. An output of ⅓ voltage dividing circuit 15 is connected to comparator 16 which receives a voltage of power source 1 as a reference voltage. An output of comparator 16 is connected to adjusting relay driver 17, and adjusting relay driver 17 is connected to power source 1 through driving LED (light emitting diode) 1303.

Auto-transformer 8 has a turn ratio of 1:N. Transistor switch 903 is connected to intermediate tap 801 of auto-transformer 8. One terminal 802 of auto-transformer 8, one terminal 1202 of coil 12 and one primary electrode 1801 of piezoelectric transformer 18 are connected together, and transistor switch 904 is connected to the connection node of them. The other primary electrode 1802 of piezoelectric transformer 18 is grounded, and secondary electrode 1803 of piezoelectric transformer 18 is connected to the other end 202 of cold cathode fluorescent tube 2. An output of comparator 10 is connected to switching relay driver 11, and switching relay driver 11 is connected to power source 1 through driving LED 905 of switching relay 9A.

The other terminal 803 of auto-transformer 8 is connected to power source 1 thorough switch 902 of switching relay 9A. Intermediate terminal 1201 of coil 12 is connected to transistor switch 1301 of adjusting relay 13. The other terminal 1203 of coil 12 is connected to switch 1302 of adjusting relay 13. Switches 1301 and 1302 of adjusting relay 13 are connected to power source 1 through switch 901 of switching relay 9.

The boost ratio of piezoelectric transformer 18 shows a frequency characteristic. Piezoelectric transformer 18 exhibits the maximum boost ratio at an inherent resonance frequency determined depending on its vibration mode, external dimension and load impedance. When the driving frequency of piezoelectric transformer 18 is taken as the abscissa, the boost ratio curve continuously changes corresponding to the driving frequency, and the boost ratio curve takes a curve like a mountain showing the maximum boost ratio at the position of the resonance frequency. It has been known that the maximum boost ratio has a proportional relation with the load impedance. In this driving circuit, a frequency positioned at a higher side than the resonance frequency is used as a control range of the driving frequency of the piezoelectric transformer. For this reason, as the driving frequency increases, the boost ratio of piezoelectric transformer decreases.

The first driving circuit section comprises power source 1; auto-transformer 8 of turn ratio 1:N in which primary and secondary windings are magnetically coupled; driving transistor 7; and primary electrodes 1801 and 1802 of piezoelectric transformer 18. Power source 1 is connected to the other terminal 803 of auto-transformer 8 through normally-on type switch 902 of switching relay 9A. Intermediate terminal 801 of auto-transformer 8 is connected to drain terminal 703 of driving transistor 7 through normally-on type switch 903 of switching relay 9B. One terminal 802 of auto-transformer 8 is connected to one primary electrode 1801 of piezoelectric transformer 18, and the other primary electrode 1802 of transformer 18 is grounded.

The second driving circuit section comprises power source 1; coil 12; driving transistor 7; and primary electrodes 1801 and 1802 of piezoelectric transistor 18. Power source 1 is connected to intermediate tap 1201 and the other terminal 1203 of coil 12 through transistor switches 1301 and 1302 of adjusting relay 13, as well as to normally-on type transistor switch 901 of switching relay 9A. One end 1202 of coil 12 is connected to drain terminal 703 of driving transistor 7 through normally-off type transistor switch 904 of switching relay 904. Moreover, one end 1202 of coil 12 is connected to one primary electrode 1801 of piezoelectric transformer 18, and the other primary electrode 1802 of piezoelectric transformer 18 is grounded.

Figure 4A:
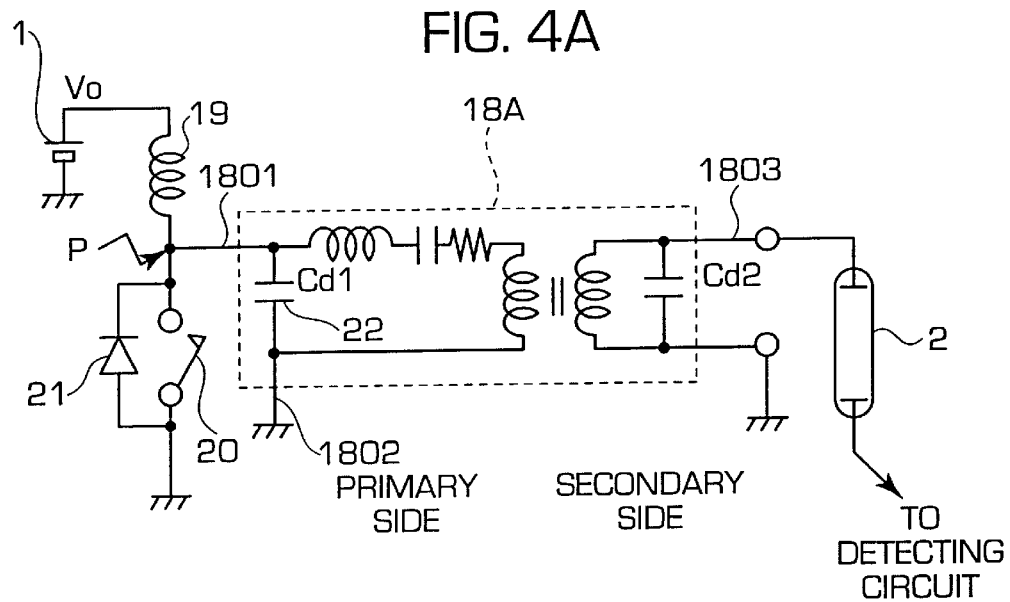
FIG. 4A is a circuit diagram showing a fundamental constitution of a driving circuit.

FIG. 4A is a diagram showing a fundamental constitution of the first and second driving circuit sections. Each of the first and second driving circuit sections is a circuit utilizing a voltage resonance as shown in FIG. 4A. The first and second driving circuit sections have the same fundamental constitution, in spite of the fact that the first driving circuit section employs an auto-transformer, that is, an inductance of boosting constitution in which the power source voltage is boosted and the second driving circuit section employs a coil, that is, an inductance of non-boosting constitution in which the power source voltage is not boosted.

With reference to the fundamental constitutions of the first and second driving circuit sections, as shown in FIG. 4A, one end of inductance 19 is connected to DC power source 1, and the other end of inductance 19 is connected to switch 20 to which diode 21 is connected in parallel, as well as to one primary electrode 1801 of piezoelectric transformer 18, and the other primary electrode 1802 of piezoelectric 18 is grounded. Equivalent input capacitance 22 is provided on the primary side of piezoelectric transformer 18, and this equivalent input capacitance 22, inductance 19 and switch 20 constitute the driving circuit serving as an LC resonance circuit. Piezoelectric transformer 18 itself constitutes a part of the driving circuit. Although other constants shown in the equivalent circuit of piezoelectric transformer 18 have effects on a circuit operation, equivalent input capacitance 22 having the largest effect on the circuit operation is shown as a representative constant.

Figure 4B:
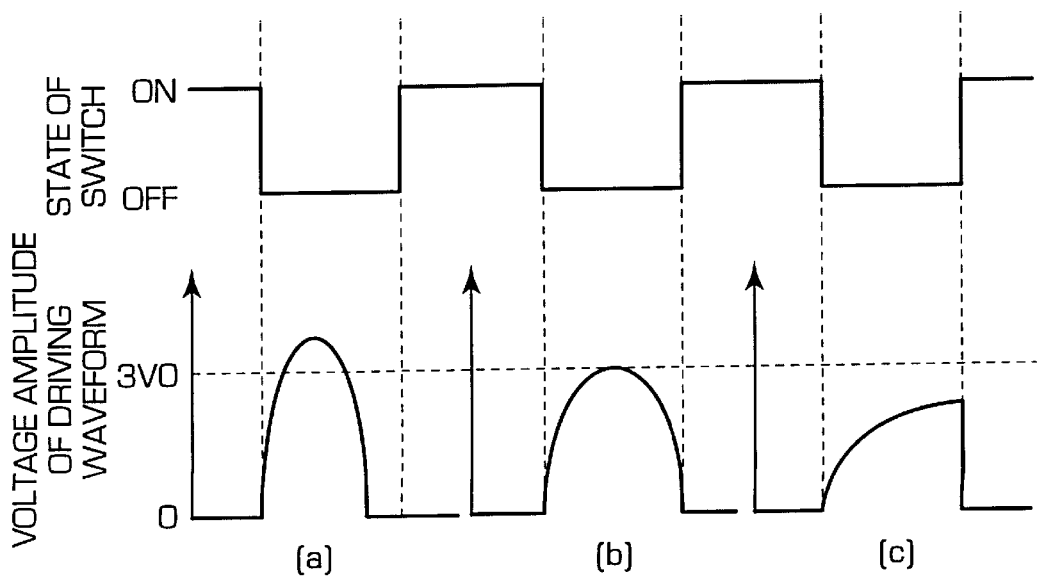
FIG. 4B is diagram showing waveforms of the driving circuit.

In this fundamental constitution, when switching operation of switch 20 is iterated, the driving waveform generated in the piezoelectric transformer is the one shown in FIG. 4B. When the switching frequency is lower than the resonance frequency of the LC resonance circuit composed of inductance 19 and equivalent input capacitance 22, the driving waveform shown in (a) of FIG. 4B is generated. Specifically, the resonance wave drops earlier than the switching cycle, and the maximum amplitude becomes more than three times as high as the voltage of power source 1. When the switching frequency is equal to the resonance frequency of the LC resonance circuit, a drop in the switching cycle is coincident with that in the resonance wave as shown in (b) of FIG. 4B, and the maximum amplitude becomes about three times as high as the voltage of power source 1. Furthermore, when the switching frequency is higher than the resonance frequency of the LC resonance circuit, the resonance wave does not drop sufficiently with the switching cycle as shown in (c) of FIG. 4B, so that the maximum amplitude becomes less than three times as high as the voltage of power source 1.

When driving efficiency is considered in these three kinds of driving waves, in case (a) of FIG. 4B a power consumption increases because of the earlier drop of the resonance wave than the switching cycle. In case (b) of FIG. 4B, a zero voltage and a zero current switching are brought about, so that a low loss is achieved. In case (c) of FIG. 4B, switch 20 is turned on before the resonance wave drops, so that a switching loss is large. Therefore, when the driving wave shown in (b) of FIG. 4B is adopted, high efficiency of the driving circuit can be achieved.

Figure 5A:
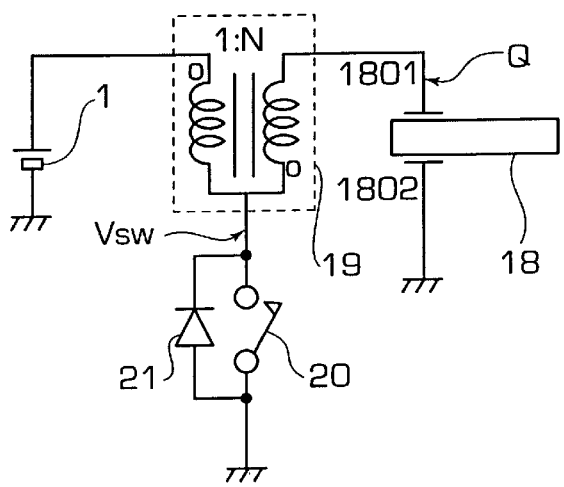
FIG. 5A is a circuit diagram showing a fundamental constitution of a first driving circuit section.
Figure 5B:
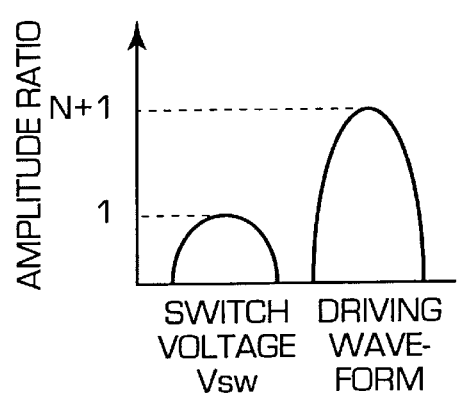
FIG. 5B is a diagram showing operational waveforms of the first driving circuit section.
Figure 6A:
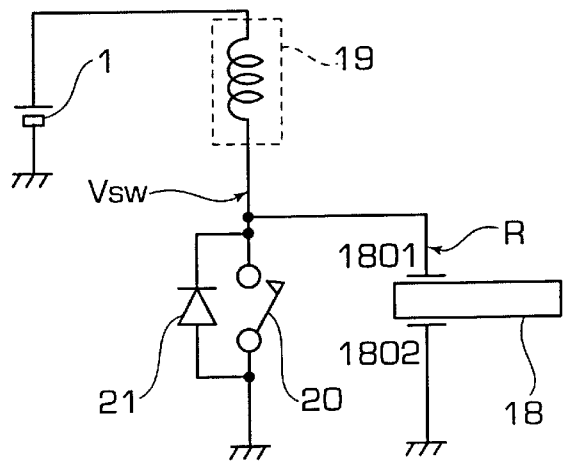
FIG. 6A is a circuit diagram showing a fundamental constitution of a second driving circuit section.
Figure 6B:
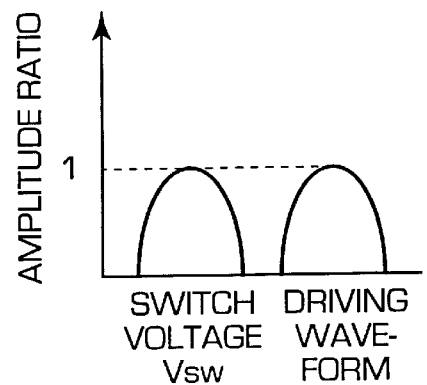
FIG. 6B is a diagram showing operational waveforms of the second driving circuit section.

FIGS. 5A, 5B, 6A and 6B show a difference of the constitutions between the first and second driving circuit sections. FIG. 5A shows the constitution of the first driving circuit section as an equivalent circuit, in which an auto-transformer serving as an inductance of the boosting constitution is used for inductance 19 (FIG. 4A), and the driving voltage boosted is generated. FIG. 5B shows the driving waveform of the piezoelectric transformer in the circuit shown in FIG. 5A. On the other hand, FIG. 6A shows the constitution of the second driving circuit section as an equivalent circuit, in which a coil serving as an inductance of the non-boosting constitution is used for inductance 19, and the driving voltage is generated with a low loss. FIG. 6B shows the driving waveform of the piezoelectric transformer in the circuit shown in FIG. 6A.

As shown in FIGS. 4A and 4B, with the use of an auto-transformer having a turn ratio of 1:N between the primary and secondary windings as the inductance, the amplitude of the driving waveform is boosted by a primary boosting so as to increase it to (N+1) times, when it is assumed that the voltage amplitude of switch 20 is 1. However, because there is a loss due to a magnetic coupling of the auto-transformer, transformation efficiency is lowered. On the other hand, when the coil is used as the inductance, a voltage amplitude of switch 20 becomes equal to an amplitude of the driving waveform, so that high efficiency can be achieved with a low loss.

An operation of the foregoing piezoelectric transformer driving circuit will be described in detail below.

Since switching relays 9A and 9B are not driven at the time of turning-on of power source 1, a first driving circuit section shown by the equivalent circuit of FIG. 5A is constituted by normally-on type switches 902 and 903, auto-transformer 8, driving transistor 7 and primary electrodes 1801 and 1802 of piezoelectric transformer 18.

At this time, since cold cathode fluorescent tube 2 which serves as the load is not being lighted, tube current detection circuit 3 detects no tube current. Comparator 4 makes a comparison between reference voltage 401 and the detection value for the tube current. When no tube current is detected or the detection value for the tube current is not coincident with a tube current value previously set in the comparator 4, voltage control oscillator 5 oscillates based on an output of comparator 4 so that the frequency is swept in a previously determined frequency range. The frequency range for the sweep is set to a frequency region positioned at a higher side than the resonance frequency of piezoelectric transformer 18. An output signal from voltage control oscillator 5 is converted by waveform shaping circuit 6 to a signal level enough to drive driving transistor 7 while keeping an oscillation frequency.

Upon receipt of an output of waveform shaping circuit 6, driving transistor 7 performs its turning-on and turning-off operations at its switching frequency based on an oscillation frequency of voltage control oscillator 5. By the switching operations of switching transistor 7, the first driving circuit section generates a voltage oscillation wave having an amplitude larger than the power source voltage, and drives piezoelectric transformer 18.

Piezoelectric transformer 18 generates a driving waveform of the voltage oscillation wave at secondary electrode 1803 thereof as a high AC voltage obtained by performing a multiplication by a boost ratio corresponding to the frequency characteristic. When cold cathode fluorescent tube 2 connected to secondary electrode 1803 starts discharging by this high AC voltage, cold cathode fluorescent tube 2 is lighted and the tube current starts to flow.

This tube current is detected by tube current detection circuit 3, and a comparison result between this tube current and reference voltage 401 is output from comparator 4. Based on this output of the comparator 4, the oscillation frequency of voltage control oscillator 5 is determined, and driving transistor 7 is driven by the determined oscillation frequency. Iterations of such feedback operation makes the tube current of the cold cathode fluorescent tube close to a tube current value which is previously set by determination of reference voltage 401. Since piezoelectric transformer 18 has a frequency characteristic which significantly changes the boost ratio at a narrow frequency range near the resonance frequency, the boost ratio of the piezoelectric transformer corresponding to the previously set tube current becomes approximately constant. When the tube current becomes equal to the set value, the driving frequency becomes approximately constant.

Since the cold cathode fluorescent tube is a discharge tube, it needs high voltages of about 500 $V_{rms}$ for a lightning voltage and about 1500 $V_{rms}$ for a lightning starting voltage. Therefore, when the amplitude of the driving wave is small, the required value for the boost ratio of piezoelectric transformer 18 becomes large. Since the driving circuit of piezoelectric transformer 18 utilizes voltage resonance, the amplitude of the driving waveform is approximately in proportion to the power source voltage. Specifically, as the power source voltage becomes lower, piezoelectric transformer 18 needs a higher boost ratio. Furthermore, when owing to lowering of the power source voltage, it becomes impossible to achieve the discharge starting voltage with the maximum boost ratio, the cold cathode fluorescent tube can not be lighted. On the contrary, as the power source voltage becomes higher, the higher boost ratio is not necessary, so that piezoelectric transformer 18 operates with a driving frequency higher than the resonance frequency.

The operation at the time of turning-on of the power source is described in more detail, the operation is as follows:

At the time of turning-on of the power source, the first driving circuit section is connected to piezoelectric transformer 18 as described above. The power source voltage at this time is expressed by $V_a$, and the voltage which is obtained by performing a peak detection rectifying for the voltage waveform of drain terminal 70 of driving transistor 7 by peak voltage detection circuit 14 is expressed by $V_{ap}$. When this voltage $V_{ap}$ is smaller than reference voltage 1001, comparator 10 makes no output, so that switching relays 9A and 9B are not driven. Thus, piezoelectric transformer 18 is driven by the first driving circuit section. Since voltage $V_a$ is the power source voltage which needs the primary boosting to light the cold cathode fluorescent tube, it is said that the first driving circuit section was selected.

When the power source voltage increases to be more than $V_a$ and it becomes $V_b$ ($V_b > V_a$), the voltage obtained by the peak detection rectifying is assumed to be $V_{bp}$ ($V_{bp} > V_{ap}$). When this voltage $V_{bp}$ is larger than reference voltage 1001, switching relay driver 11 operates based on the output of comparator 10, and switching relays 9A and 9B are driven. By the drives of switching relays 9A and 9B, transistors 902 and 903 are turned off. Alternatively, transistors 901 and 904 are turned on, piezoelectric transformer 18 is driven by the second driving circuit section. Since $V_b$ is the power source voltage which enables the cold cathode fluorescent tube to light without performing the primary boosting, the second driving circuit section is selected.

In the driving circuit of piezoelectric transformer 18, with changes of the driving frequency and the amplitudes of the driving waveform, matching condition between the resonance frequency of the driving circuit and the switching frequency of driving transistor 7 changes. For this reason, it is impossible to keep the driving waveform with high efficiency shown in (b) of FIG. 4B throughout a wide power source voltage range. Accordingly, in order to achieve high efficiency throughout the wide power source voltage range, it is necessary to change the resonance frequency of the driving circuit so as to fit it with the driving frequency of piezoelectric transformer 18. Therefore, it is required to monitor the voltage waveform of drain terminal 703 of driving transistor 7 and the inductance must be adjusted to make the switching condition of the driving transistor 7 close to a zero voltage and a zero current switching. In this driving circuit, one of two inductance values, that is, a inductance value from a total inductance of coil 12 and another inductance value of a inductance component from intermediate tap 1201, is selected by adjusting relay 13, so that the inductance is made variable and high efficiency is achieved.

When the power source voltage further increases to $V_c$ ($V_c \geq V_b$), the voltage which is obtained by a peak detection rectifying by a peak voltage detection circuit 14 is expressed by $V_{cp}$. Comparator 16 makes a comparison between power source voltage $V_c$ and $(1/3)V_{cp}$ obtained by dividing $V_{cp}$ by 1/3 dividing circuit 15.

When $(1/3)V_{cp} > V_c$ is satisfied, the driving waveform takes the shape as is shown in (a) of FIG. 4B, and the driving circuit is in a state where high efficiency is not achieved. In order to lower the resonance frequency of the driving circuit, the inductance is made large. Since the inductance of coil 12 is the one of the two inductance values having a larger value when adjusting relay 13 is driven, comparator 16 generates an output to drive adjusting relay driver 17.

On the other hand, when $(1/3)V_{cp} < V_c$ is satisfied, the driving waveform takes the shape as is shown in (c) of FIG. 4B, and the driving circuit is also in a state where high efficiency is not achieved. Accordingly, to increase the resonance frequency of the driving circuit, the inductance is made small. Since the inductance of coil 12 is the one of the two inductance values having a smaller value when the adjusting relay 13 is not driven, comparator 16 outputs no output therefrom so that adjusting relay driver 17 is not driven.

As described above, when the driving waveform is expressed as shown in (b) of FIG. 4, the driving circuit operates with high efficiency. However, since the inductance can take only one of the two values which are large or small, when it is intended to obtain the waveform shown in (b) of FIG. 4B, the preferred inductance becomes indeterminate. Consequently, by allowing comparator 16 to posses a hysteresis characteristic, it is prevented that the inductance becomes indeterminate.

As described above, in the piezoelectric transformer driving circuit shown in FIG. 3, when the power source voltage has a low value requiring the primary boosting for lighting the cold cathode fluorescent tube, the first driving circuit section constituted by the auto-transformer is selected. When the power source voltage is elevated to a value which requires no primary boosting, the second driving circuit section which is constituted so as to achieve high efficiency is selected. At the time when the second driving circuit section operates, the voltage waveform of drain terminal 703 is monitored, and an inductance closer to the condition of the zero voltage and the zero current switching is selected from the two inductance values which respectively take small and large values, thus further achieving high efficiency of the driving circuit. Furthermore, when the cold cathode fluorescent tube is lighted with a high power source voltage which needs no primary boosting, the second driving circuit section is selected. When the power source voltage decreases to a voltage which needs the primary boosting, the first driving circuit section is selected. The driving circuit sections and the inductance values are switched based on the voltage waveform amplitude of drain terminal 703, whereby the driving circuit capable of coping with a wide range power source voltage and driving piezoelectric transformer 18 with high efficiency can be realized.

Particularly, by constituting each of switching relays 9A and 9B and adjusting relay 13 by an optically coupled type transistor switch, each of these relays can operate at a speed higher than an electromagnetic relay, so that a unstableness upon switching operations can be lessened. Switching relays 9A and 9B and adjusting relay 13 constituted by the optically coupled transistor switch use LEDs for their driving diodes 905 and 1303. When the LED emits a light, the gate voltage of the switching transistor included the relay in increases to its threshold voltage, so that a normally-off type transistor is turned on and a normally-on type transistor is turned off. A switching time by this transistor switch is 1 millisecond (ms) or less. Since the LED is used for driving a relay, power consumption for driving the relay can be reduced compared to an electromagnetic relay using a driving coil. FIG. 7 shows correspondence between the optically coupled transistor switch 91 and the electromagnetic relay 92.

FIG. 8 shows a constitution of the piezoelectric transformer driving circuit of another embodiment of the present invention. The piezoelectric transformer driving circuit shown in FIG. 8 differs from that shown in FIG. 3 in that the number of intermediate taps of coil 12 is n (n≧2) and inductance selection circuit 23 for selecting one among the intermediate taps is provided instead of adjusting relay 13. The output of ⅓ voltage dividing circuit 15 is connected to a control input terminal of inductance selection circuit 23. Therefore, a comparator which possesses a hysteresis characteristic and is connected to the output of ⅓ voltage dividing circuit 15, and an adjusting relay driver are not provided.

Inductance selection circuit 23 is connected to power source 1 through switch 901 of switching relay 9A, and is connected to the other end 1203 of coil 12 and n pieces of the intermediate taps of coil 12. When piezoelectric transformer 18 is driven by the second driving circuit section constituted by power source 1, coil 12, driving transistor 7 and primary electrodes 1801 and 1802 of piezoelectric transformer 18, inductance selection circuit 23 selects an intermediate tap from n intermediate taps, which corresponds an inductance value in which the voltage of power source 1 and the output voltage of ⅓ voltage dividing circuit 15 are in agreement with each other.

According to the driving circuit shown in FIG. 8, the inductance value can be precisely selected so that piezoelectric transformer 18 can be driven under the condition of the zero voltage and the zero current switching as shown in (b) of FIG. 4B. Thus, the driving efficiency of the second driving circuit section is further improved. Furthermore, a range of selection of the inductance is more widened, whereby a range of an operation voltage can be widened. Therefore, a further high efficiency driving and a widened range of an operation voltage can be advantageously achieved.

When optically coupled type transistor switch 91 is replaced by electromagnetic relay 92 as to the switching relay and the adjusting relay as shown in FIG. 7, switching capacity of the switch becomes larger, so that electromagnetic relay 92 can cope with the piezoelectric transformer which receives a large current.

As is apparent from the above descriptions, the fundamental operation of the piezoelectric transformer driving circuit of the present embodiment will be summarized below.

At the time of starting, the piezoelectric transformer is driven with an arbitrary power source voltage by the first driving circuit section using auto-transformer 8 which operates at a wide range of an operation voltage. In case of that the power source is low, since the boost ratio of the circuit is not sufficient when only the boost ratio of piezoelectric transformer 18 is employed, piezoelectric transformer 18 is driven by the first driving circuit section.

When the turn ratio of the auto-transformer is set to N, the first driving circuit section performs a primary boosting for the voltage resonance wave generated in the switches of the driving circuit and boosts it by (N+1) times, thus generating the boosted voltage as a driving waveform. Since the amplitude of this voltage resonance waveform is approximately in proportion to the power source voltage, when it is required to produce a high voltage using a low power source voltage, such primary boost is, for example, necessary for lighting the cold cathode fluorescent tube. Controlling of the driving frequency can reduce the boost ratio of piezoelectric transformer 18 utilizing the frequency characteristic of piezoelectric transformer 18, so that a constant output voltage can be achieved even when the power source voltage becomes higher. For this reason, the range of the operation voltage of the first driving circuit section becomes wider.

However, since auto-transformer 8 is boosted by the magnetic coupling, the piezoelectric transformer can not be driven with high efficiency due to a loss in the auto-transformer. Accordingly, when the amplitude of the switch voltage waveform of the driving circuit is monitored and the voltage amplitude which requires no primary boosting for lighting cold cathode fluorescent tube 2 is found, automatic switching from the first driving circuit section to the second driving circuit section is carried out.

Since the second driving circuit section uses coil 12 instead of auto-transformer 8, the second driving circuit section exhibits a less loss owing to the magnetic coupling, so that the piezoelectric transformer can be driven with high efficiency. Moreover, by making it possible to set the coil inductance of the second driving circuit section in plural steps, the optimum inductance can be selected so as to produce a driving waveform with higher driving efficiency.

As described above, this driving circuit has the following structure: That is, when the power source voltage is a voltage incapable of driving a load such as a cold cathode fluorescent tube which can not be lighted in spite of driving piezoelectric transformer 18 with its maximum boost ratio, the driving circuit drives the load by the first driving circuit section comprising the primary boosting function. Furthermore, when the power source voltage is a voltage capable of driving the load such as the cold cathode fluorescent tube which can be lighted without the primary boosting, the second driving circuit section performs a high efficiency driving. The selection between the first and second driving circuit sections and the selection of the inductance in the second driving circuit section are automatically performed based on the switching voltage amplitude of the driving circuit of piezoelectric transformer 18.

Although the preferred embodiment of the present invention has been described in detail, it should be understood that various changes, substitutions and alternations can be made therein without departing from spirit and scope of the inventions as defined by the appended claims.

What is claimed is:

1. A method for driving a piezoelectric transformer wherein an inductance is provided in series with a parallel combination of an equivalent input capacitance of a piezoelectric transformer and a switching transistor between a pair of power source terminals, a main current path of the switching transistor short-circuiting the equivalent input capacitance, comprising the steps of:

providing a first inductance element having high voltage gain characteristics and a second inductance element having low voltage gain characteristics, as the inductance;

detecting an amplitude of a driving waveform across the main current path of the switching transistor; and switching a connection of the piezoelectric transformer with the inductance from the first inductance element to the second inductance element when the amplitude of the driving waveform exceeds a predetermined threshold value.

2. The method according to claim 1, further comprising the step of switching the connection of the piezoelectric transformer with the inductance from the second inductance element to the first inductance element when the amplitude of the driving waveform becomes lower than the predetermined threshold value.

3. The method according to claim 2, wherein a load of the piezoelectric transformer is a cold cathode fluorescent tube.

4. The method according to claim 1, further comprising the step of adjusting an inductance value of the second inductance element in accordance with the amplitude of the driving waveform.

5. The method according to claim 2, further comprising the step of adjusting an inductance value of the second inductance element in accordance with the amplitude of the driving waveform.

6. The method according to claim 5, wherein the inductance value is adjusted so that a peak value of the amplitude of the driving waveform is about three times as high as a power source voltage.

7. The method according to claim 2, wherein controlling of a switching cycle of the switching transistor is performed by detecting an output load current of the piezoelectric transformer.

8. The method according to claim 1, wherein an inductance value of the second inductance element is adjusted in accordance with a power source voltage so that the driving waveform of the main current path between terminals of the switching transistor is close to a condition of a zero voltage state and a zero current state at a time of switching of the switching transistor.

9. A method for driving a piezoelectric transformer wherein an inductance is provided in series with a parallel combination of an equivalent input capacitance of a piezoelectric transformer and a switching transistor between a pair of power source terminals, a main current path of the switching transistor short-circuiting the equivalent input capacitance, comprising the steps of:

detecting a drive waveform between terminals of the main current path of the switching transistor; and adjusting the inductance in accordance with a power source voltage so that the driving waveform is close to a condition of a zero voltage state and a zero current state at a time of switching of the switching transistor.

10. The method according to claim 9, wherein an amplitude of the driving waveform is detected and the inductance is adjusted in accordance with the amplitude.

11. The method according to claim 9, wherein an output load current of the piezoelectric transformer is detected and a switching cycle of the switching transistor is controlled in accordance with the output load current.

12. A method for driving a piezoelectric transformer wherein an inductance is provided in series with a parallel combination of an equivalent input capacitance of a piezoelectric transformer and a switch transistor between a pair of power source terminals, a main current path of the switching transistor short-circuiting the equivalent input capacitance, comprising the steps of:

providing a first inductance element having high voltage gain characteristics and a second inductance element having low voltage gain characteristics, as the inductance; and switching the first and second inductance elements so that the piezoelectric transformer is driven by the first inductance element when a load is not driven sufficiently due to insufficient voltage amplification of the piezoelectric transformer because of a lower power source voltage and the piezoelectric transformer is driven by the second inductance element when the load is drive sufficiently because of a higher power source voltage.

13. A driving circuit for driving a piezoelectric transformer, comprising:

an inductance circuit provided in series with a parallel combination of an equivalent input capacitance of the piezoelectric transformer and a switching transistor, provided between power source terminals, the inductance circuit including a first inductance element having high voltage gain characteristics and a second inductance element having low voltage gain characteristics, the first and second inductance elements being selectable alternately;

said switching transistor having both terminals of a main current path thereof connected in parallel to the equivalent input capacitance;

an amplitude detection circuit for detecting an amplitude of a driving waveform between the terminals of the main current path of the switching transistor; and an inductance selection circuit for selecting the first inductance element when the detected amplitude is lower than a predetermined threshold value and for selecting the second inductance element when the detected amplitude exceeds the predetermined threshold value.

14. The driving circuit according to claim 13, wherein a load of the piezoelectric transformer is a cold cathode fluorescent tube.

15. The driving circuit according to claim 13, wherein the first inductance element is an auto-transformer and the second inductance element is a coil.

16. The driving circuit according to claim 13, further comprising a control circuit for performing variable controlling of an inductance value of the second inductance element in accordance with the amplitude.

17. The driving circuit according to claim 15, further comprising an adjusting circuit for selecting an inductance value of the coil in accordance with the amplitude, wherein the coil has one or more intermediate taps.

18. The driving circuit according to claim 13, further comprising a current detection circuit for detecting a load current of the piezoelectric transformer, and a voltage control oscillator for allowing the switching transistor to perform a switching operation, wherein an oscillation frequency of the voltage control oscillator is controlled by an output of the current detection circuit.

19. A driving circuit for driving a piezoelectric transformer comprising:

a series circuit constituted by an equivalent input capacitance of the piezoelectric transformer and an inductance circuit and provided between power source terminals;

a switching transistor having both terminals of a main current path thereof in parallel connected to a part of the series circuit including the equivalent input capacitance;

an amplitude detection circuit for detecting an amplitude of a driving waveform between the terminals of the main current path of the switching transistor; and a control circuit for performing variable controlling of the inductance in accordance with the amplitude detected by the amplitude detection circuit.

20. The driving circuit according to claim 19, further comprising a current detection circuit for detecting a load current of the piezoelectric transformer, and a voltage control oscillator for allowing the switching transistor to perform a switching operation, wherein an oscillation frequency of the voltage control oscillator is controlled by an output of the current detection circuit.

21. A driving circuit for driving a piezoelectric transformer comprising:

an inductance circuit provided in series with a parallel combination of an equivalent input capacitance of the piezoelectric transformer and a switching transistor, provided between power source terminals, the inductance circuit including a first inductance element having high voltage gain characteristics and a second inductance element having low voltage gain characteristics, the first and second inductance elements being selectable alternately;

said switching transistor having both terminals of a main current path thereof connected in parallel to the equivalent input capacitance; and an inductance selection circuit for selecting the first inductance element when a load is not driven sufficiently due to insufficient voltage amplification of the piezoelectric transformer because of a lower power source voltage and for selecting the second inductance element when the load is driven sufficiently because of a higher power source voltage.

* * * * *

UNITED STATES PATENT AND TRADEMARK OFFICE
CERTIFICATE OF CORRECTION

PATENT NO. : 6,133,672
DATED : October 17, 2000
INVENTOR(S) : Hiroshi Sasaki, et. al.

It is certified that error appears in the above-identified patent and that said Letters Patent is hereby corrected as shown below:

Column 1, line 61, delete "I0" insert --Io--.

Signed and Sealed this

First Day of May, 2001

Attest:

NICHOLAS P. GODICI

Attesting Officer     Acting Director of the United States Patent and Trademark Office